United States Patent
Takeuchi et al.

(10) Patent No.: US 7,617,600 B2
(45) Date of Patent: Nov. 17, 2009

(54) PROCESS OF MAKING AN ELECTRONIC CIRCUIT DEVICE HAVING FLEXIBILITY AND A REDUCED FOOTPRINT

(75) Inventors: Yasutaka Takeuchi, Nishikamo-gun (JP); Hironao Hayashi, Motosu-gun (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 725 days.

(21) Appl. No.: 10/855,510

(22) Filed: May 28, 2004

(65) Prior Publication Data

US 2004/0256148 A1  Dec. 23, 2004

(30) Foreign Application Priority Data

Jun. 20, 2003  (JP) ............................. 2003-176968

(51) Int. Cl.
  H05K 3/36  (2006.01)
  H05K 3/22  (2006.01)
(52) U.S. Cl. .............................. 29/855; 29/832; 29/835; 29/841; 29/830; 156/233; 156/235; 156/239; 174/254; 174/260; 174/536; 174/538; 438/127
(58) Field of Classification Search .................. 29/829, 29/830, 832, 835, 827, 846, 620, 621, 841, 29/855; 156/230, 233, 235, 238, 239; 174/536, 174/538, 254, 260; 361/813, 817; 438/126, 438/127
See application file for complete search history.

(56) References Cited

U.S. PATENT DOCUMENTS

| | | | | |
|---|---|---|---|---|
| 3,729,819 A | * | 5/1973 | Horie | ........................ 29/846 X |
| 4,303,934 A | * | 12/1981 | Stitt | ............................ 257/753 |
| 4,334,352 A | * | 6/1982 | VanBenthuysen | ............. 29/620 |
| 4,877,565 A | * | 10/1989 | Tani et al. | ..................... 264/105 |
| 6,514,847 B1 | * | 2/2003 | Ohsawa et al. | ........... 438/126 X |
| 2002/0192875 A1 | * | 12/2002 | Igarashi et al. | ............... 438/126 |

FOREIGN PATENT DOCUMENTS

| | | | |
|---|---|---|---|
| JP | 55-016388 | | 5/1980 |
| JP | 57130437 A | * | 8/1982 |
| JP | 02-034986 | | 2/1990 |
| JP | 7-29846 | | 6/1995 |
| JP | 07-263847 | | 10/1995 |
| JP | 2001-177224 | | 6/2001 |
| JP | 2001-210998 | | 8/2001 |
| JP | 04-036599 | | 6/2002 |
| JP | 2002-234298 | | 8/2002 |

OTHER PUBLICATIONS

Lee, C. J., "SIM: New, Versatile Polymers for Electronic Industries", Proceedings 39th Electronic Components Conference, pp. 896-900, May 1989.*

* cited by examiner

Primary Examiner—A. Dexter Tugbang
(74) Attorney, Agent, or Firm—Kenyon & Kenyon LLP

(57) ABSTRACT

An electronic circuit formed by removing only a baseboard from an electronic module. The electronic circuit may be formed by providing a baseboard made of a water-soluble material, applying a water-soluble polymer as an insulating material to the baseboard, and forming an electronic module by mounting electronic parts to wires formed on the baseboard. The formation of the electronic circuit may also include removing the baseboard from the electronic module by dissolving the baseboard in water and deforming and resin-encapsulating the electronic module, which includes the electronic parts and wires in the state of lacking the baseboard.

2 Claims, 12 Drawing Sheets

UNNECESSARY PORTION

PROCESS OF MAKING AN ELECTRONIC CIRCUIT DEVICE HAVING FLEXIBILITY AND A REDUCED FOOTPRINT

BACKGROUND OF THE INVENTION

1. Field of the Invention

The present invention relates to an electronic circuit device and, more particularly, to a method of forming an electronic module as an electronic circuit device, which consists of electronic parts and wires, and an electronic circuit device formed by such a method.

2. Description of the Related Art

Conventionally, there is known an electronic circuit device having a structure in which electronic parts are mounted on a flexible printed circuit board. An example of such an electronic circuit device is shown in Japanese Laid-Open Patent Application No. 2001-210998. The electronic circuit device disclosed in the above-mentioned patent document is formed by mounting electronic parts onto a baseboard that is supported by being attached to a reinforcing board, which is removed after the electronic parts are mounted onto the baseboard. According to the above-mentioned forming method of electronic circuit devices, the flexible baseboard can be easily handled during the mounting process of the electronic parts and the conveyance process before or after the mounting process since the baseboard is supported by the reinforcing board. Additionally, the electronic parts can be reliably mounted onto the baseboard by appropriately removing the reinforcing board after the mounting process.

In recent years, with an improvement in performance of electronic equipments, the number of parts (elements) mounted on an electronic circuit device has been increased, which results in an increase in an occupied area (footprint) of the electronic circuit device. However, a reduction in a space in which an electronic equipment is installed is required even under such a condition. In the above-mentioned conventional electronic circuit device having the baseboard on which the electronic parts are mounted, there is a limitation in miniaturization and reduction in footprint even if a flexible circuit board is used as the baseboard.

SUMMARY OF THE INVENTION

It is a general object of the present invention to provide an improved and useful electronic circuit device in which the above-mentioned problems are eliminated.

A more specific object of the present invention is to provide an electronic circuit device having high-flexibility to reduce a footprint thereof and a method of forming such an electronic circuit device.

In order to achieve the above-mentioned object, there is provided according to the present invention a method of forming an electronic circuit device having an electronic module including electronic parts and wires, the method comprising: forming the electronic module by mounting the electronic parts to the wires formed on a baseboard; removing the baseboard from the electronic module; deforming the electronic module that lacks the baseboard; and fixing a configuration of the deformed electronic module.

According the present invention, the baseboard is removed from the electronic module, which is formed by mounting the electronic parts onto the wires formed on the baseboard, while the electronic parts are connected to the wires. After the baseboard is removed from the baseboard, the electronic module contains only the electronic parts and the wires interconnecting the electronic parts. Accordingly, the electronic circuit apparatus does not have the baseboard, and a space occupied by the baseboard is omitted, which reduces the size of the electronic circuit device. Moreover, since the electronic module from which the baseboard is removed can be deformed without being restrained by the baseboard, the electronic circuit device can be formed into a configuration corresponding to a configuration of a space or location in which the electronic circuit device is installed.

In the above-mentioned method, the baseboard may be formed of a water-soluble material, and the baseboard may be removed from the electronic module by dissolving the baseboard in water.

Additionally, in the method according to the present invention, after removing the baseboard from the electronic module and before deforming the electronic module, a configuration of the electronic module may be maintained by covering the electronic module by a visco-elastic material. Further, in the method according to the present invention, after removing the baseboard from the electronic module and before deforming the electronic module, a configuration of the electronic module may be maintained by covering the electronic module by a metal foil. Alternatively, in the method according to the present invention, after removing the baseboard from the electronic module and before deforming the electronic module, a configuration of the electronic module may be maintained by covering the electronic module by a silicone rubber.

According to the above-mentioned invention, the entire electronic module after the baseboard is removed is reinforced by the visco-elastic material, the metal foil or the silicon rubber. Thus, the electronic module can be given a certain degree of strength during a process of deforming the electronic module with an appropriate flexibility so that the electronic module can be freely deformed.

Additionally, in the method according to the present invention, when fixing the configuration of the deformed electronic module, a resin may be applied onto the deformed electronic module so as to seal the entire electronic module. Accordingly, the resin applied to the electronic module can serve as a member that gives a strength to the electronic module to fix the configuration thereof and also serves as a sealing member that protects the electronic parts and the wires.

Additionally, there is provided according to another aspect of the present invention an electronic circuit device comprising an electronic module that includes an assembly of electronic parts and wires, the electronic circuit device being formed by removing a baseboard from the assembly of the electronic parts and the wires so as to form the electronic module, deforming the electronic module, and fixing a configuration of the deformed electronic module.

Further, there is provided according to another aspect of the present invention an electronic circuit device comprising: an electronic module including a plurality of electronic parts and wires interconnecting the electronic parts; and an insulating coat that substantially covers the entire electronic module and fixes a configuration of the electronic module, wherein the electronic module is deformed into a configuration corresponding to an uneven part on which the electronic circuit device is installed.

Other objects, features and advantages of the present invention will become more apparent from the following detailed description when read in conjunction with the accompanying drawings.

DETAILED DESCRIPTION OF THE PREFERRED EMBODIMENTS

Figure 1A:
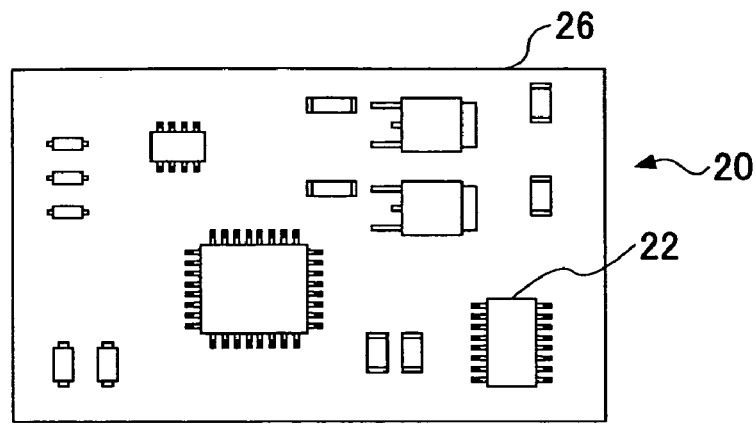
FIGS. 1A, 1B and 1C are plan views of an electronic circuit device according to a first embodiment of the present invention.
Figure 1B:
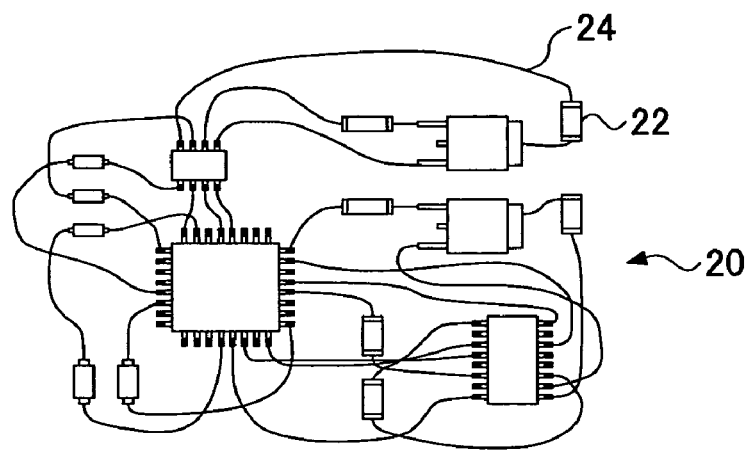
Figure 1C:
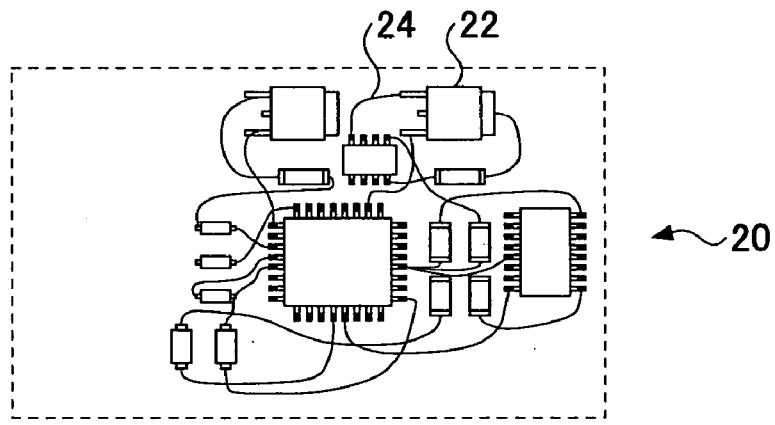
Figure 2A:
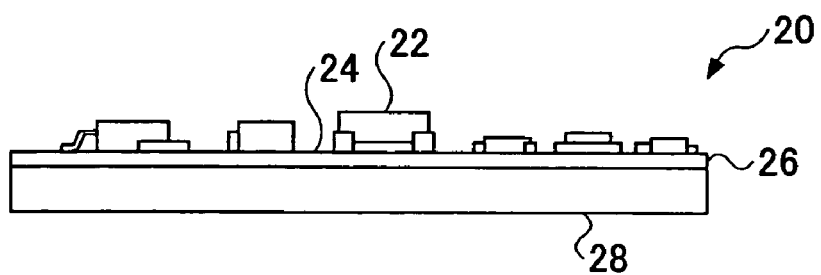
FIGS. 2A and 2B are side view of the electronic circuit device according to the first embodiment of the present invention.
Figure 2B:
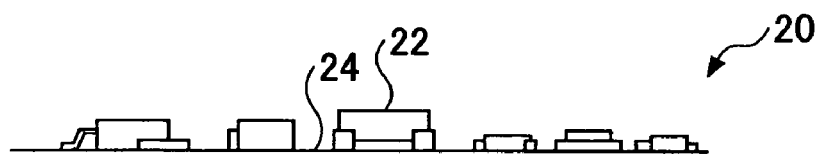

A description will now be given, with reference to FIGS. 1A, 1B and 1C and FIGS. 2A and 2B, of a first embodiment of the present invention. FIGS. 1A, 1B and 1C are plan views of an electronic circuit device 20 according to the first embodiment of the present invention. FIGS. 2A and 2B are side views of the electronic circuit device 20. FIGS. 1A, 1B and 1C and FIGS. 2A and 2B show states of the electronic circuit device in the process of formation in time series.

The electronic circuit device 20 comprises a plurality of electronic parts 22 that are elements such as a capacitor, a resistor or an integrated circuit (IC) and wires 24 that are conductive material interconnecting the electronic parts. The electronic circuit device 20 finally has a structure, which does not have a baseboard that supports the electronic parts 22. That is, the electronic circuit device 20 finally consists of the electronic parts 22 and the wires 24. Such an assembly of the electronic parts 22 and the wires 24 is referred to as an electronic module. A description will be given below of a method of forming the electronic circuit device 20 having no baseboard.

First, the wires 24 are formed by printing a conductive circuit pattern on a copper foil, etc., on the baseboard 26. The baseboard 26 is formed of a water-soluble material such as denatured polyvinyl alcohol (for example, Nippon Synthetic Chemical Industry Co., Ltd., designation: ECOMATI AX) or a water-soluble paper (for example, Mishima Paper Co., Ltd., designation: MDP). Accordingly, the baseboard 26 has a characteristic of dissolving in water. A paste containing solder grains, an adhesive, etc. are applied through a mask to desired positions on the baseboard 26 (printed circuit board) on which the wires 24 are formed. Then, the plurality of electronic parts 22 are placed on the baseboard 26 where the paste or adhesive is applied. The electronic parts 22 are subjected to heat treatment while being placed on the baseboard 26 so that the electronic parts 22 are mounted and fixed on the baseboard 26. It should be noted that, if the water-soluble baseboard 26 has an insufficient strength, the electronic parts 22 may be mounted on the baseboard 26 in a state where the baseboard 26 is placed on a plastic plate 28 as shown in FIG. 2A within a condition where the plastic plate 28 does not give influence to the mounting process of the electronic parts 22 onto the baseboard 26 or a solder-reflow process.

After an electronic module comprising the electronic parts 22 mounted on the wires 24 that are formed on the baseboard 26 is formed as shown in FIG. 2A, the plastic plate 28 is removed, if necessary, and the electronic module is immersed into water. Since the baseboard 26 is a water-soluble material, if the baseboard 26 is immersed into water, the baseboard 26 dissolves into water. Accordingly, as shown in FIG. 2B, the baseboard 26 is removed from the electronic module in which the electronic parts 22 are mounted. After the baseboard 26 is dissolved into water, the electronic parts 22 and the wires 24 formed of a copper foil are in a state where they are not supported by the baseboard 26. Thus, an insulating material is applied onto the electronic module comprising the electronic parts 22 and the wires 24 at the same time or immediately after the baseboard 26 is dissolved into water as mentioned later so that the electronic parts 22 and the wires 24 are coated with an insulating film.

The insulating material applied to the above-mentioned electronic module is selected from materials, which are deformable and flexible even after being cured. As such a material, there is a synthetic resin solution such as metacry-acrylic copolymer resin (for example, Rohm and Harse Company, designation: pararoid B72) or an ultraviolet-curable resin such as urethane acrylate (for example, Three Bond Company, designation: 3061H). Additionally, the wires 24 are easily deformable since the wires 24 are formed of a copper foil as mentioned above. For this reason, after the electronic parts 22 and the wires 24 of the electronic module, which does not have the baseboard 26, are coated with the insulating material, the electronic module can be deformed (change in configuration) without the wires 24 being cut by deformation. Therefore, relative positions between the electronic parts 22 and the wires 24 can be changed.

Then, the electronic module covered with the insulating material is changed in the configuration or shape thereof or compacted into a smaller configuration so that the electronic module matches a configuration of a location where the electronic circuit device 20 is installed. Thereafter, the electronic module is solidified or fixed in its configuration by applying and curing epoxy resin or the like in a state where the configuration of the electronic module matches the configuration of the location where the electronic circuit device 20 is installed.

According to the above-mentioned structure, due to the removal of the baseboard 26 as shown in FIG. 1B, the electronic circuit device 20, which is constituted only by the plurality of electronic parts 22 and the wires 24 which interconnect the electronic parts 22, can be installed on the uneven part in the installation location in a flexible manner. Additionally, the electronic circuit device 20 itself can be miniaturized, which achieves a reduction in the space where the electronic circuit device 20 is installed.

By the way, there is a possibility of being in a state where the configuration and arrangement of the electronic parts 22 and the wires 24, which are formed of a copper foil, can be easily changed during a period from the removal of the baseboard 26 from the electronic module until the electronic module is deformed and solidified. Accordingly, the wires 24 may short-circuit with each other, which causes the electronic module difficult to be handled. Thus, in the present embodiment, the handling of the electronic module is made easy by applying the insulating material onto the electronic module at the time when the baseboard 26 is removed from the electronic module or immediately after the removal of the baseboard 26, or by compacting or miniaturizing the electronic module as shown in FIG. 1C.

A description will now be given, with reference to FIG. 3A through FIG. 8C, of first to sixth method of facilitating the handling of the electronic module comprising the electronic parts 22 and the wires 24 and from which the baseboard 26 is removed. It should be noted that, in FIG. 3A through FIG. 8C, the suffix letters A, B, . . . indicate the time series sequence of the processes according to the methods.

[First Method]

Figure 3A:
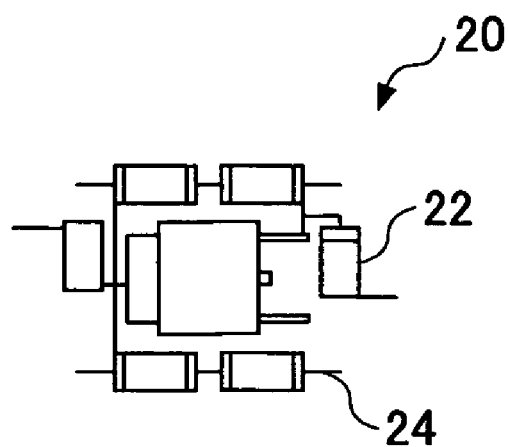
FIGS. 3A, 3B and 3C are illustrations for explaining a first method of facilitating handling of an electronic module.
Figure 3B:
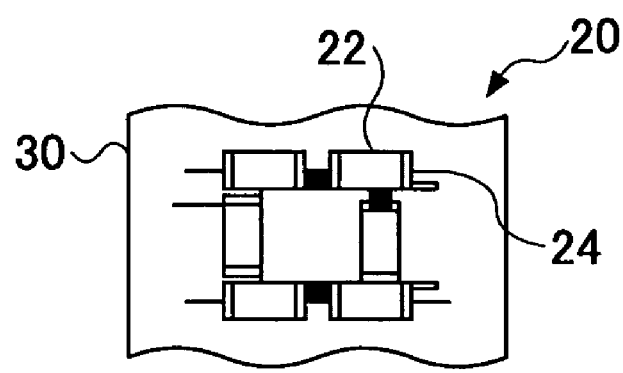
Figure 3C:
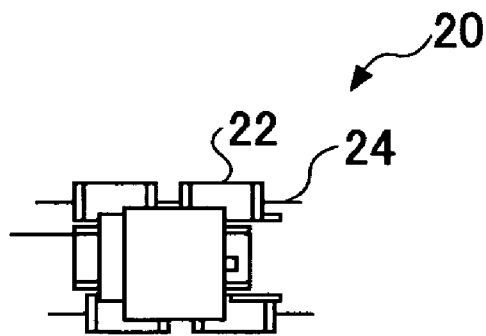

FIGS. 3A, 3B and 3C illustrate the first method of facilitating the handling of the electronic module. In the first method, when the electronic module is immersed into water so as to dissolve and remove the baseboard 26, a water-soluble polymeric material as an insulating material is applied to the water. As the water-soluble polymeric material, carboxy methyl cellulose (CMC) with a high viscosity (for example, Daicel Chemical Industries, Ltd., designation: CMC Daicel) can be used. In this structure, the water-soluble polymeric material dissolves and spreads in water when the baseboard 26 dissolves in the water, which results in the electronic parts 22 and the wires 24 of the electronic module being coated with the polymeric material due to its viscosity. Then, after the coating is applied, the configuration change of the electronic module is performed, an adhesive, etc., is cured so as to fix the configuration of the electronic module.

It should be noted that mere the coating of the electronic module with the viscosity may be insufficient to strengthen the electronic module, and the electronic module may still be difficult to handle. Thus, as shown in FIG. 3B, a metal foil 30 such as an aluminum foil, which is easily deformable but maintains its configuration or shape, may be applied to the electronic module coated with the insulating material. If such a process is performed, the metal foil 30 may be applied by utilizing the viscosity of the water-soluble polymeric material coating the electronic module. After the metal foil 30 is applied onto the electronic module, the electric module is changed in its configuration or shape together with the metal foil 30, first a portion where the metal foil 30 is not applied is applied with an adhesive and the adhesive is cured, and, then, the metal foil 30 is pealed off so as to fix a portion where the metal foil 30 is removed, as shown in FIG. 3C. It should be noted that, in view of a shielding effect, a heat radiation effect and a strengthening effect, the electronic module may serve as the electronic circuit device 20 without removing the metal foil 30.

According to the above-mentioned first method, since the electronic module is coated with the water-soluble polymeric material or the metal foil 30 simultaneously with the removal of the baseboard 26 from the electronic module, the wires 24 can surely be prevented from short-circuiting. Thus, the electronic module can be easily handled immediately after the removal of the baseboard 26.

[Second Method]

Figure 4A:
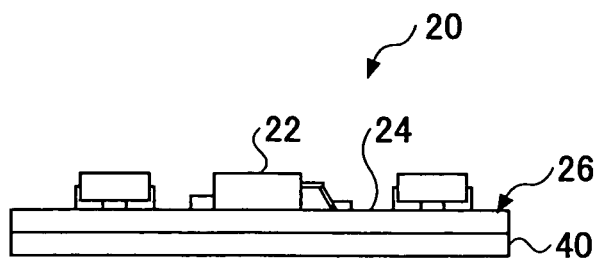
FIGS. 4A, 4B, 4C and 4D are illustrations for explaining a second method of facilitating handling of an electronic module.
Figure 4B:
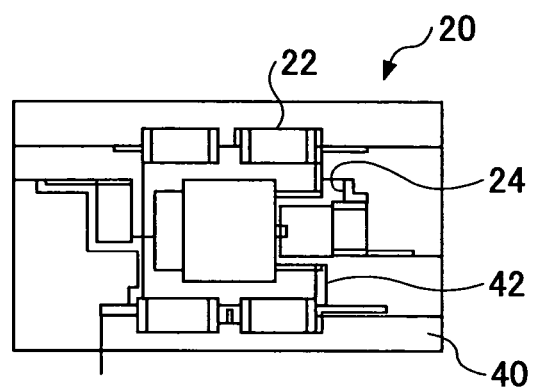

FIGS. 4A through 4D illustrate the second method of facilitating the handling of the electronic module. In the second method, before dissolving and removing the baseboard 26 from the electronic module, the electronic module integrated with the baseboard 26 is set on a block 40 as shown in FIG. 4A. A clearance 42 according to a groove or a hole corresponding to the configuration of the electronic parts 22 and the wires 24 are formed in the block 40 directly under the electronic parts 22 and the wires 24 of the electronic module. Therefore, when the electronic module is set on the block 40 as mentioned above, the electronic parts 22 and the wires 24 face the clearance 42 of the block 40 with the baseboard 26 therebetween. It should be noted that the block 40 may be formed in one piece or may be divided into a plurality of parts so as to be detachable from each other.

Figure 4C:
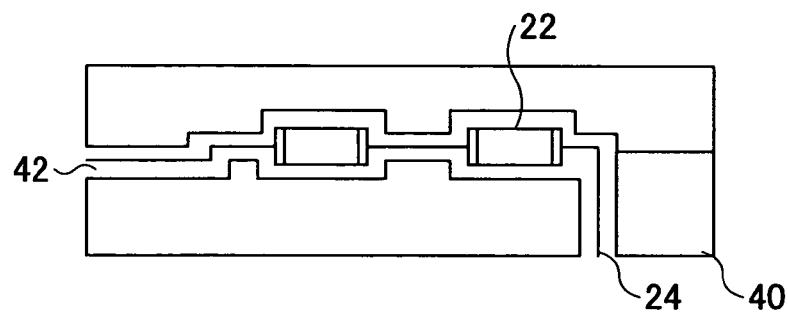
Figure 4D:
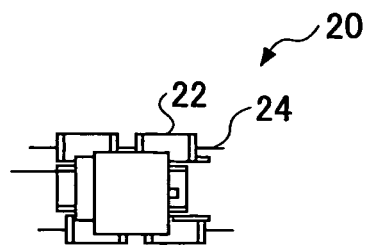

In the above-mentioned structure, when the electronic module is immersed into water and the baseboard 26 is dissolved and removed, the electronic parts 22 and wires 24 move downward since they are no longer supported by the baseboard 16. Since the electronic parts 22 and wires 24 face the clearance 42 of the block 40 via the baseboard 26, if the support of the baseboard 26 does not exist, the electronic parts 22 and wires 24 fit into the clearance 42 of the block 40 as shown in FIG. 40B. In this state, as shown in FIG. 4C, an insulating material such as a silicone or a silicone rubber, which is flexible even when being cured, is supplied to the clearance 42 and is cured. After the silicone rubber is cured, the block 40 is removed entirely, the configuration of the electronic module covered with the cured silicon is changed and the configuration is fixed by an adhesive as shown in FIG. 4D.

According to the above-mentioned second method, since the electronic parts 22 and the wires 24, which are fitted in the mold frame (block 40), are coated with the silicone rubber after the removal of the baseboard 26, the wires 24 can surely be prevented from short-circuiting due to the presence of the flexible silicone rubber. Thus, the electronic module can be easily handled immediately after the removal of the baseboard 26.

[Third Method]

Figure 5A:
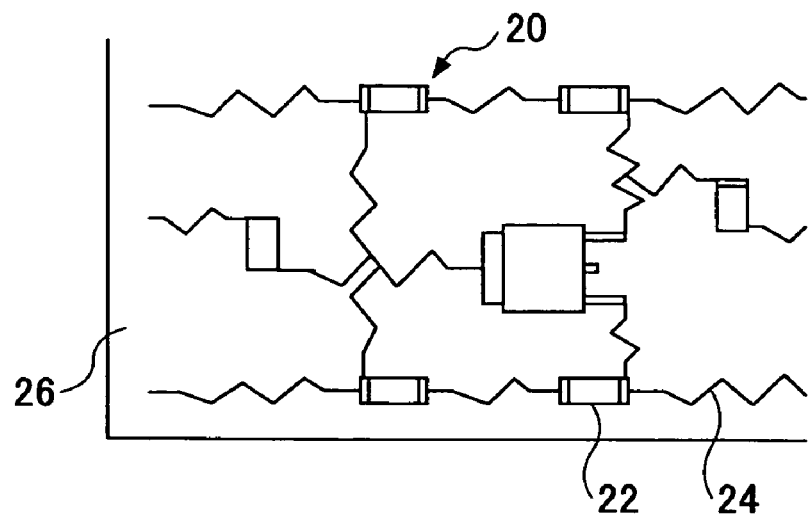
FIGS. 5A, 5B and 5C are illustrations for explaining a third method of facilitating handling of an electronic module.
Figure 5B:
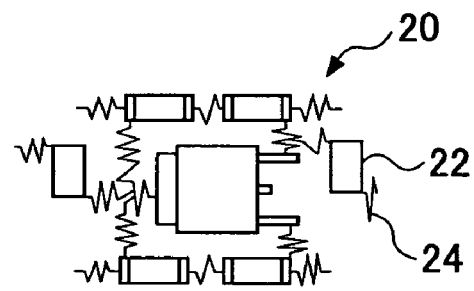
Figure 5C:
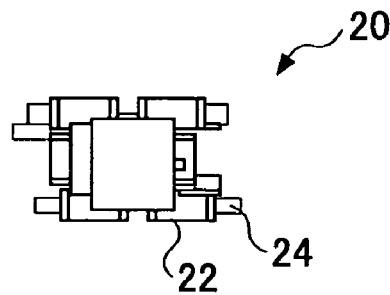

FIGS. 5A through 5C illustrate the third method of facilitating the handling of the electronic module. In the third method, the wires 24 embedded in the water-soluble board 26 have an elastic structure such as a spring structure or an accordion-folded structure. The wires 24 are embedded in the baseboard 26 in a state where the wires 24 are stretched from a normal state, as shown in FIG. 5A, so that the wires 24 are stretched while the baseboard 26 is present. Then, in this state, the electronic parts 22 are mounted and fixed on the baseboard 26. When the baseboard 26 dissolves in water in this state, as shown in FIG. 5B, the wires 24 contract as shown in FIG. 5B since the force to maintain the wires 24 by the baseboard 26 is removed. After the wires 24 are contracted, an adhesive is applied onto the electronic module and the adhesive is cured as shown in FIG. 5C.

According to the above-mentioned third embodiment, since the wires 24 are contracted due to its spring action after the removal of the baseboard 26, the wires 24 can surely be prevented from short-circuiting or relaxing due to the contraction. Thus, the electronic module can be easily handled after the removal of the baseboard 26.

[Fourth Method]

Figure 6A:
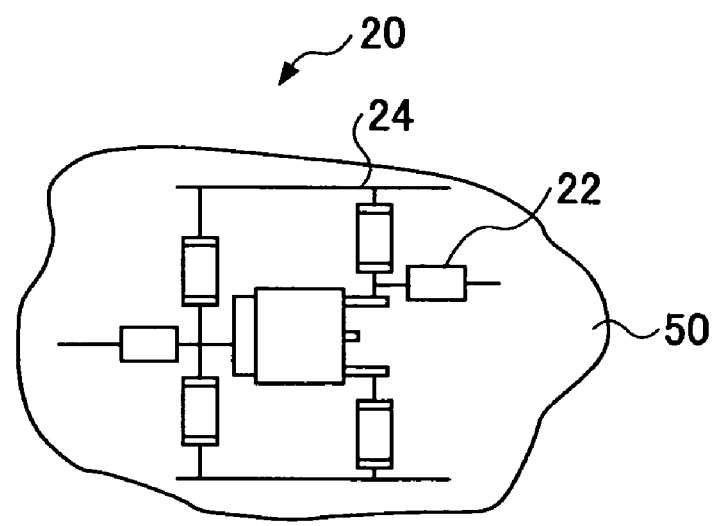
FIGS. 6A and 6B are illustrations for explaining a fourth method of facilitating handling of an electronic module.
Figure 6B:
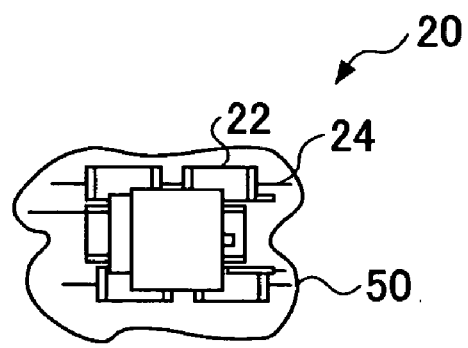

FIGS. 6A and 6B illustrate the fourth method of facilitating the handling of the electronic module. In the fourth method, after mounting the electronic parts 22 onto the baseboard (printed-circuit board) 26 and before removing the baseboard 26 from the electronic module by dissolving in water, a desiccating gel 50 is applied onto the electronic module. The desiccating gel 50 is swollen if a water component exists in the atmosphere, and is shrunk if the water component is removed. After the desiccating gel 50 is applied onto the electronic module, the electronic module is immersed into water so as to dissolve the baseboard 26.

In the above-mentioned structure, the desiccating gel 50 is swollen as shown in FIG. 6A simultaneously when the baseboard 26 dissolves in water, and the electronic parts 22 and the wires 24 of the electronic module are coated with the desiccating gel 50 due to its viscosity. After the electronic module is coated, the swollen gel 50 is dried so as to be dehydrated and shrunk. At this time, the wires interconnecting the electronic parts 22 are contracted due to the shrinkage of the gel 50. After the wires 24 are shrunk, an adhesive or the like is applied onto the electronic module and the adhesive is cured as shown in FIG. 6B.

According to the above-mentioned fourth method, since the electronic module is coated by the swollen desiccating gel 50 simultaneously with the removal of the baseboard 26 and thereafter the wires are contracted due to the shrinkage of the gel 50, the wires 24 can surely be prevented from short-circuiting or relaxing due to the contraction. Thus, the electronic module can be easily handled after the removal of the baseboard 26.

[Fifth Method]

Figure 7A:
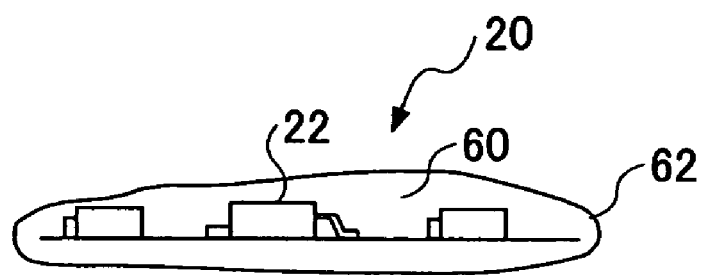
FIGS. 7A and 7B are illustrations for explaining a fifth method of facilitating handling of an electronic module.
Figure 7B:
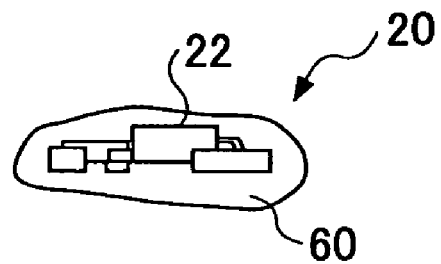

FIGS. 7A and 7B illustrate the fifth method of facilitating the handling of the electronic module. In the fifth method, after removing the baseboard 26 from the electronic module, an adhesive 60 is applied onto the electronic module and the adhesive 60 is cured while the electronic module is wrapped with a thermally shrinkable film 62 as shown in FIG. 7A. The thermally shrinkable film 62 is made of polyethylene, etc., (for example, Sekisui Film Company Limited, designation: polyshrinkLB). Before the adhesive 60 is completely shrunk, the thermally shrinkable film 62 is heated so as to be shrunk. Under the present circumstances, the wires 24 which interconnect the electronic parts 22 are contracted due to the shrinkage of the thermally shrinkable film 62 as shown in FIG. 7B. After the wires 24 are shrunk, the thermally shrinkable film 62 is removed and the adhesive is completely cured so as to fix the configuration of the electronic module. It should be noted that if the thermally shrinkable film 62 is shrunk in a state where the adhesive is not completely cured, the wires 24 may short-circuit with each other. Thus, in order to avoid such a problem, it is appropriate to cause the thermally shrinkable film 62 to shrink while the adhesive 60 is half-cured where the adhesive 60 is cured to a certain degree.

According to the above-mentioned fifth method, since the wires 24 contracted due to the thermal shrinkage of the thermally shrinkable film 62 which covers the electronic module applied with the adhesive 60 after the removal of the baseboard 26 from the electronic module, the wires 24 can surely be prevented from short-circuiting or relaxing due to the contraction. Thus, the electronic module can be easily handled after the removal of the baseboard 26.

[Sixth Method]

Figure 8A:
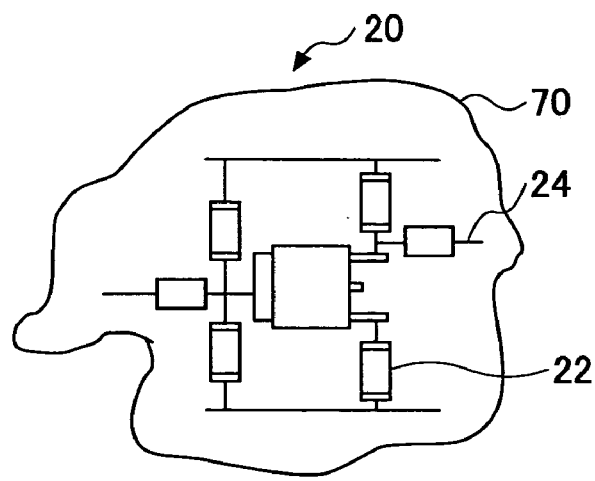
FIGS. 8A, 8B and 8C are illustrations for explaining a sixth method of facilitating handling of an electronic module.
Figure 8B:
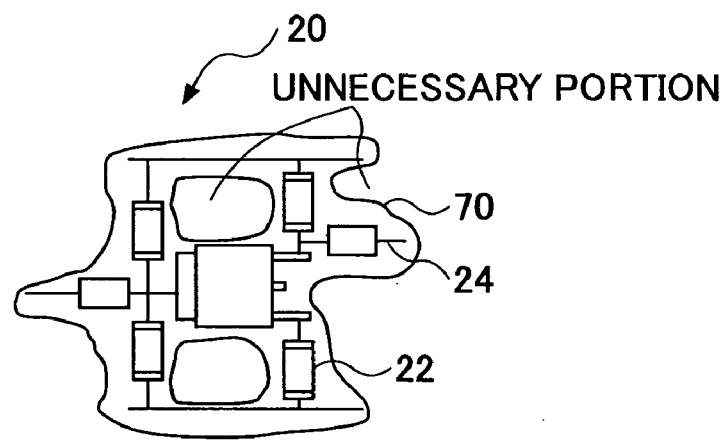
Figure 8C:
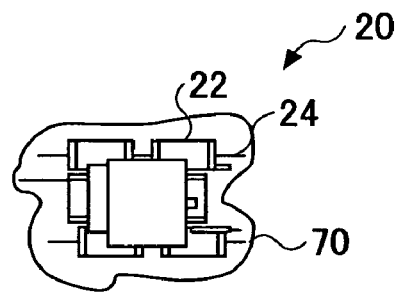

FIGS. 8A through 8C illustrate the sixth method of facilitating the handling of the electronic module. In the sixth method, after removing the baseboard 26 from the electronic module, a masking sol 70 as an insulating material is applied to the electronic module as shown in FIG. 8A. The masking sol 70 has high fluidity with low viscosity, and has the characteristics of liquid (for example, GSI cleos, Inc. designation: Mr. masking sol). After the masking sol 70 is cured, an unnecessary portion of the masking sol 70, that is, a portion corresponding to a space where the electronic parts 22 and the wires 24 are not present is cut out as shown in FIG. 8B. Then, the electronic module having the masking sol 70 is reduced and deformed so as to match the location where the electronic circuit device 20 is installed, and an adhesive is applied and cured so as to fix the configuration of the electronic module as shown in FIG. 8C.

According to the above-mentioned sixth method, since the electronic module is coated with the masking sol 70 and an unnecessary portion of the masking sol 70 is cut out after the baseboard 26 is removed by being immersed into water, the electronic module can be reduced in its size and the electronic module can be easily handled after the removal of the baseboard 26.

[Seventh Method]

Figure 9A:
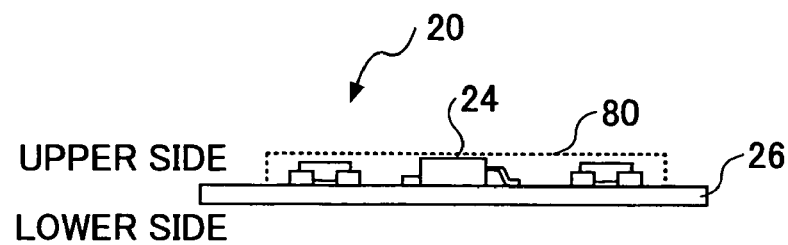
FIGS. 9A, 9B and 9C are illustrations for explaining a seventh method of facilitating handling of an electronic module.
Figure 9B:
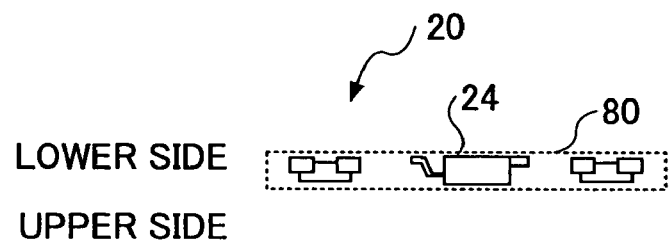
Figure 9C:
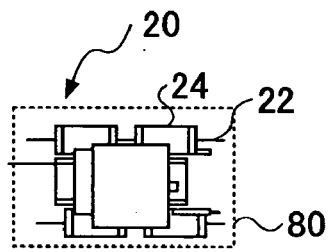

FIGS. 9A through 9C illustrate the seventh method of facilitating the handling of the electronic module. In the seventh method, after mounting the electronic parts 22 onto the baseboard (printed-circuit board) 26, the mounting surface of the baseboard 26 is coated with an insulating material such as the above-mentioned polymeric material solution or the ultraviolet curable resin in a state where the baseboard 26 is attached to the electronic module as shown in FIG. 9A. The electronic module is immersed into water in this state so as to dissolve the baseboard 26 in water. Then, a portion of the electronic module where the insulating coat is not applied due to the presence of the baseboard 26 is coated with the insulating material as shown in FIG. 9B. Thus, after the insulating coat is applied onto the entire electronic module, the electronic module is deformed to match a configuration of a location where the electronic circuit device 20 is installed, and an adhesive is applied to the electronic module and is cured so as to seal and fix the electronic module as shown in FIG. 9C.

According to the above-mentioned seventh method, since the mounting surface of the electronic module is coated with the insulating material in the state where the baseboard 26 is attached to the electronic module and, thereafter, the surface of the electronic module facing the baseboard 62 is coated with the insulating material in the state where the baseboard is remove by being dissolved in water, the electronic module can surely be prevented from short-circuiting with each other. Thus, the electronic module can be easily handled immediately after the removal of the baseboard 26.

Figure 10A:
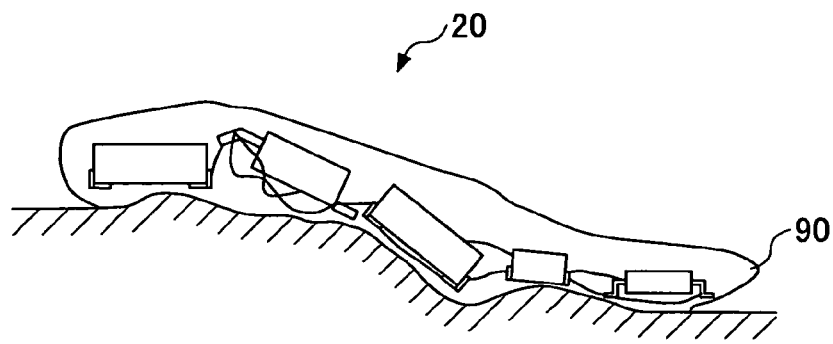
FIGS. 10A, 10B and 10C are illustrations for explaining a location of installing the electronic circuit device according to the first embodiment of the present invention.
Figure 10B:
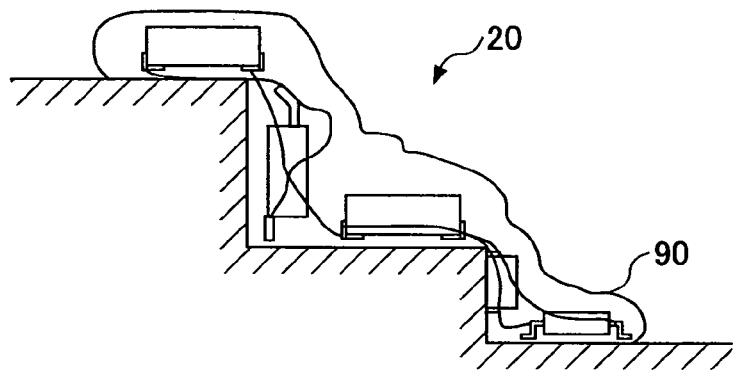
Figure 10C:
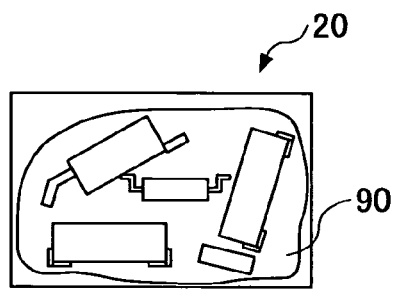
Figure 11A:
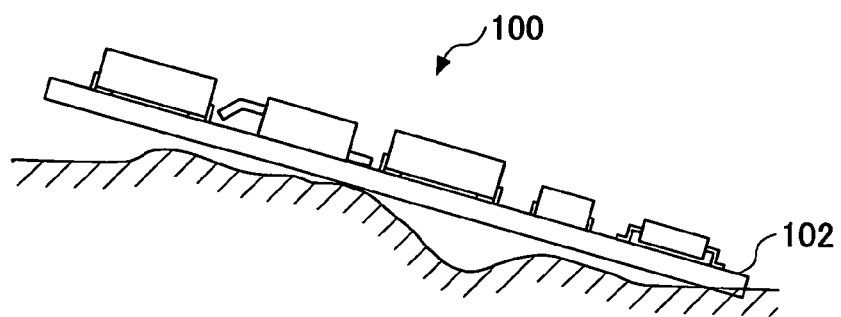
FIGS. 11A, 11B and 11C are illustrations for explaining a configuration and arrangement of an electronic circuit device having a baseboard with comparison with the electronic circuit device according to the first embodiment of the present invention.
Figure 11B:
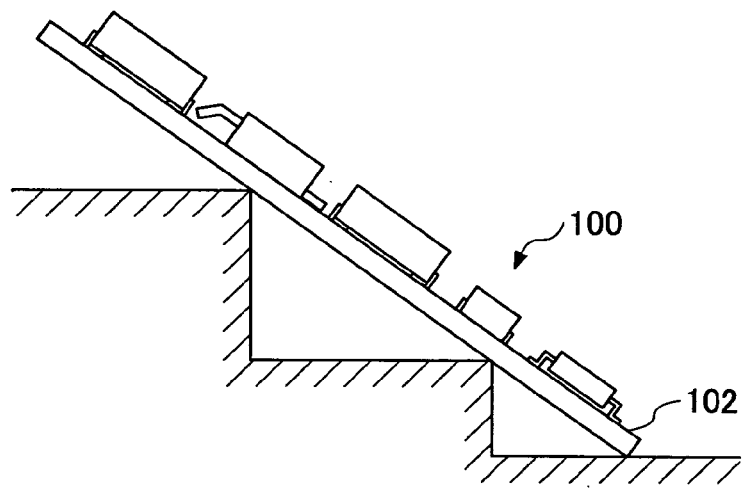
Figure 11C:
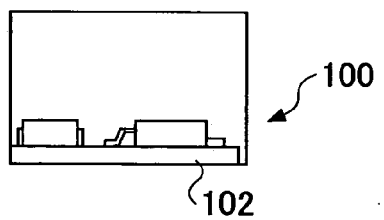

FIGS. 10A, 10B and 10C are illustrations for explaining a location of installing the electronic circuit device 20 according to the present embodiment. FIGS. 11A, 11B and 11C are illustrations for explaining a configuration and arrangement of an electronic circuit device having a baseboard with comparison with the electronic circuit device 20 according to the present embodiment. In a case where electronic parts and wires are mounted on a baseboard 102 having a certain rigidity such as in an electronic circuit device 100 shown in FIGS. 11A, 11B and 11C, it is difficult to install the electronic circuit device 100 on an uneven part having a curved surface or a step as shown in FIGS. 11A and 11B, and it is required to enlarge a two-dimensional occupied area in mounting all electronic parts as shown in FIG. 11C.

On the other hand, the electronic circuit device 20 according to the present embodiment has a final structure which comprises the electronic parts 22 and wires 24 without the baseboard 26 and the configuration is freely changeable while the electronic parts 22 and the wires 24 are supported by the baseboard 26 in the initial stage of manufacture. For this reason, according to the present embodiment as shown in FIGS. 10A, 10B and 10C, it becomes possible to install the electronic circuit device 20 on an uneven part having a curved surface or a step without being restricted by the baseboard 26 as shown in FIGS. 10A and 10B, and the electronic circuit device 20 can be squeezed into a limited space without requiring a large occupied area as shown in FIG. 10C.

Although the electronic circuit device having no baseboard may have disadvantages that a heat radiation property, an insulating property and configuration stability of the electronic parts is deteriorated, such a problem can be solved by covering the electronic circuit device 20 with a heat radiating gel (for example, Gel Tech Co., Ltd., designation: DP100 or DP200) having an excellent heat-radiating property, insulating property and configuration stability so as to improve the heat-radiation property during operations of the electronic parts and improve the insulating property and configuration stability after installation.

It should be noted that, in the above-mentioned embodiment, each of the synthetic resin solution such as metacry-acrylic copolymer resin, the ultra-violet curable resin such as urethane acrylate, the water-soluble polymeric material such as CMC and the desiccating gel 50 serve as a "visco-elastic material".

Additionally, although the baseboard 26 is formed of a water-soluble material in the above-mentioned first embodiment and the electronic circuit device 20 having no baseboard is formed by dissolving the baseboard 26 in water, the present invention is not limited to such a structure, and the baseboard may be formed of a polystyrene foam so as to form the electronic circuit device by removing the polystyrene foam by applying a solvent such as a thinner to the baseboard.

A description will now be given, with reference to FIGS. 12A, 12B and 12C, of a second embodiment of the present invention.

In the above-mentioned first embodiment, the electronic circuit device 20 having the electronic parts 22 and the wires 24 without a baseboard is formed by forming the baseboard 26 mounting the electronic parts 22 by a water-soluble material and dissolving the baseboard 26 in water. On the other hand, in the second embodiment of the present invention, the baseboard 26 is not dissolved but separated from the electronic parts 22 by removing adhesion force so as to form the electronic circuit device 20 having no baseboard.

Figure 12A:
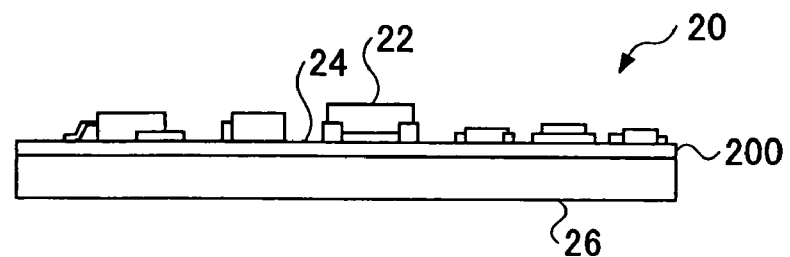
FIGS. 12A, 12B and 12C are illustrations for explaining a method of forming an electronic circuit device according to a second embodiment of the present invention.
Figure 12B:
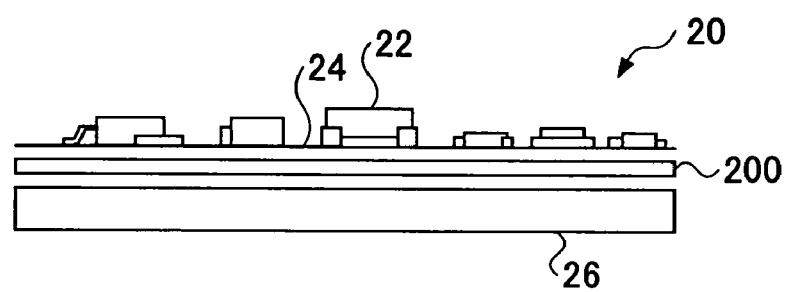
Figure 12C:
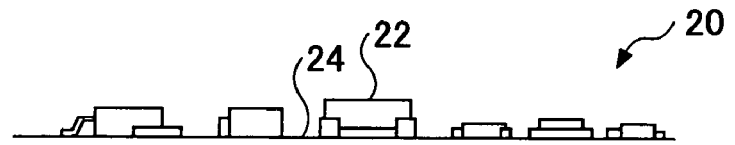

FIGS. 12A, 12B and 12C are illustrations for explaining a method of forming the electronic circuit device according to the second embodiment of the present invention. In FIGS. 12A, 12B and 12C, parts that are the same as the parts shown in FIGS. 1A, 1B and 1C and FIGS. 2A and 2B are given the same reference numerals, and descriptions thereof will be omitted. That is, in the present embodiment, the baseboard 26 is formed of a regular material which is not a water-soluble material, and the wires 24 are attached to the baseboard 26 by a peelable adhesive tape 200.

The peelable adhesive sensitive tape 200 (for example, NITTO DENKO CORP., designation: Livaalpha) has a high-adhesion at a normal state while the tape 200 looses adhesion force when a heat is applied thereto. The electronic parts 22 are mounted on desired portions in a state where the wires 24 are attached to the baseboard 26, and a heat treatment is applied according to solder-reflow.

In the above-mentioned structure, if the heat treatment is performed at the time of mounting the electronic parts 22, adhesion force between the wires 24 and the baseboard 26 is removed since the peelable adhesive tape 200 loses adhesion due to the heat. In such a case, the wires 24 connected with the electronic parts 22 and the baseboard 26 are separable from each other, and, thus, the wires 24 can be separated from the baseboard 26. That is, the baseboard 26 can be removed from the electronic module comprising the electronic parts 22 and the wires 24. Thus, when the baseboard 26 is removed from the electronic module and the electronic module contains only the electronic parts 22 and the wires 24, an insulating material is applied to the electronic module according to one of the above-mentioned fourth to sixth methods so as to facilitate handling of the electronic module. Then, after the electronic module is deformed into a desired configuration or shrunk, the electronic module is sealed and fixed by curing an adhesive applied thereto.

As mentioned above, according to the present embodiment, the baseboard 26 is removed from the electronic module by separation of the electronic parts and the baseboard 26 by the peealable adhesive tape. That is, the electronic circuit device 20 having no baseboard can be formed without deteriorating its functions. Thus, similar to the above-mentioned first embodiment, the electronic circuit device 20, which consists of the insulation coated electronic parts 22 and the wires interconnecting the electronic parts 22, can be flexibly installed in an installation location with a certain degree of freedom. Additionally, the electronic circuit device 20 itself can be reduced in its size. Therefore, also in the present embodiment, effects the same as the above-mentioned first embodiment can be achieved.

Although a peelable adhesive tape, which can be peeled by applying a heat, is used as the peerable adhesive tape 200 to attach the wires 24 to the baseboard 26 in the above-mentioned second embodiment, other peelable adhesive tapes such as one which can be peeled by irradiation of an ultra-violet light (UV). As the peelable adhesive tape which can be peeled by irradiation of an ultra-violet light, there is one designated as "selfer" manufactured by Sekisui Chemical Co., Ltd, for example. In this structure, since the baseboard 26 and the electronic parts 22 including the wires 24 are separated from each other by irradiating an ultra-violet light onto the electronic module after mounting the electronic parts 22 onto the wires 24 attached to the baseboard 26 via the peelable adhesive tape, the electronic circuit device having no baseboard can be easily formed.

The present invention is not limited to the specifically disclosed embodiments, and variations and modifications may be made without departing from the scope of the present invention.

The present application is based on Japanese priority application No. 2003-176968 filed Jun. 20, 2003, the entire contents of which are hereby incorporated by reference.

What is claimed is:

1. A method of forming an electronic circuit, comprising the steps of:
providing a baseboard made of a water-soluble material,
applying a water-soluble polymer as an insulating material to the baseboard;
forming an electronic module by mounting electronic parts to wires formed on the baseboard;
removing the baseboard from the electronic module by dissolving the baseboard in water; and after removing the baseboard from the electronic module, deforming and resin-encapsulating the electronic module, which includes the electronic parts and wires.

2. The method as claimed in claim 1, wherein, after removing the baseboard from the electronic module and before deforming the electronic module, a configuration of the electronic module is maintained by covering the electronic module by a metal foil.

* * * * *

UNITED STATES PATENT AND TRADEMARK OFFICE
CERTIFICATE OF CORRECTION

PATENT NO. : 7,617,600 B2
APPLICATION NO. : 10/855510
DATED : November 17, 2009
INVENTOR(S) : Takeuchi et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1217 days.

Signed and Sealed this

Nineteenth Day of October, 2010

David J. Kappos
*Director of the United States Patent and Trademark Office*